US00RE42145E

(19) United States
(12) Reissued Patent
Hobson

(10) Patent Number: US RE42,145 E
(45) Date of Reissued Patent: Feb. 15, 2011

(54) WRITE-ASSISTED SRAM BIT CELL

(76) Inventor: Richard F. Hobson, School of Engineering Sc., Simon Fraser University, Burnaby, B.C. (CA), V5A 1S6

(21) Appl. No.: 11/581,231

(22) Filed: Oct. 12, 2006

Related U.S. Patent Documents

Reissue of:
(64) Patent No.: 6,804,143
Issued: Oct. 12, 2004
Appl. No.: 10/404,562
Filed: Apr. 2, 2003

(51) Int. Cl.
*G11C 11/40* (2006.01)

(52) U.S. Cl. ..... 365/154; 365/156; 365/203
(58) Field of Classification Search ..... 365/156
See application file for complete search history.

(56) References Cited

U.S. PATENT DOCUMENTS 4,823,314 A * 4/1989 Sharp ..... 365/51
5,018,102 A * 5/1991 Houston ..... 365/95
5,103,113 A * 4/1992 Inui et al. ..... 327/108
5,504,711 A * 4/1996 Lu ..... 365/189.11
5,694,354 A * 12/1997 Anami et al. ..... 365/154
5,754,468 A * 5/1998 Hobson ..... 365/156
5,805,496 A * 9/1998 Batson et al. ..... 365/154
5,973,965 A * 10/1999 Berthold et al. ..... 365/188
6,011,711 A * 1/2000 Hodges et al. ..... 365/154
6,044,010 A * 3/2000 Deschene ..... 365/154
6,118,689 A * 9/2000 Kuo et al. ..... 365/154
6,205,049 B1 * 3/2001 Lien et al. ..... 365/154
6,212,094 B1 * 4/2001 Rimondi ..... 365/156
6,341,083 B1 * 1/2002 Wong ..... 365/154
6,459,611 B2 * 10/2002 Rimondi ..... 365/156
7,672,182 B2 * 3/2010 Park et al. ..... 365/203

OTHER PUBLICATIONS

A. Silburt et al., "A 180–MHz 0.8–μm BiCMOS Modular Memory Family of DRAM and Multiport SRAM", IEEE J. Solid State Circuits, V. 28, No. 3, Mar. 1993, pp. 222–232.*

* cited by examiner

*Primary Examiner*—Tan T. Nguyen
(74) *Attorney, Agent, or Firm*—McDonnell Boehnen Hulbert & Berghoff LLP

(57) ABSTRACT

An SRAM bit cell with cross-coupled inverters has separate write and read buses. Writing is performed through an NMOS pass transistor. Reading is performed through a PMOS transistor. Because the NMOS transistor does not pass a logic 1 as easily as logic 0, assistance is needed to speed up writing of a logic 1 value relative to the time required to write a logic 0 value. An NMOS pre-charge transistor is coupled between the read bus and ground potential; and, a read is performed simultaneously with a write. This conditions the cell by weakening one of the inverters, such that they cross-couple more quickly when a logic 1 value is written into the cell. Alternatively, a single-ended read/write bus can be coupled to the NMOS pass transistor with write-assistance provided by grounding the PMOS pass transistor.

65 Claims, 8 Drawing Sheets

WRITE-ASSISTED SRAM BIT CELL

Matter enclosed in heavy brackets [ ] appears in the original patent but forms no part of this reissue specification; matter printed in italics indicates the additions made by reissue.

TECHNICAL FIELD

*Notice: More than one reissue application has been filed for the reissue of U.S. Pat. No. 6,804,143. The reissue applications are application Ser. Nos. 11/581,231 (the present application) and 12/962,008, the latter of which is a continuation reissue application of U.S. Pat. No. 6,804,143.*

This invention facilitates efficient writing of data into a static random access memory (SRAM) bit cell, particularly if a logic 0 value stored in the bit cell is to be overwritten by a logic 1 value.

BACKGROUND

FIGS. 1 and 2 schematically depict a typical prior art single binary digit (i.e. 1-bit) SRAM bit cell incorporating cross-coupled inverters 10, 12. Inverter 10 is formed by PMOS "pull-up" transistor 14 and NMOS "pull-down" transistor 16. PMOS transistor 14's source is connected to a logic "high" voltage reference ($V_{DD}$), PMOS transistor 14's drain is connected in series with NMOS transistor 16's drain, NMOS transistor 16's source is connected to a logic "low" voltage reference (ground), and PMOS transistor 14's gate is connected to NMOS transistor 16's gate. Inverter 12 is formed by PMOS pull-up transistor 18 and NMOS pull-down transistor 20. PMOS transistor 18's source is connected to $V_{DD}$, PMOS transistor 18's drain is connected in series with NMOS transistor 20's drain, NMOS transistor 20's source is connected to ground, and PMOS transistor 18's gate is connected to NMOS transistor 20's gate. Inverters 10, 12 are cross-coupled by connecting the gates of PMOS transistor 14 and NMOS transistor 16 to the drains of PMOS transistor 18 and NMOS transistor 20 to define a first storage node S1; and, by connecting the gates of PMOS transistor 18 and NMOS transistor 20 to the drains of PMOS transistor 14 and NMOS transistor 16 to define a second storage node S2. The source-to-drain path of NMOS pass transistor 22 is connected between first storage node S1 and first bit line BIT, and the gate of NMOS transistor 22 is connected to word line WL. The source-to-drain path of NMOS pass transistor 24 is connected between second storage node S2 and second bit line $\overline{\text{BIT}}$, and the gate of NMOS transistor 24 is connected to word line WL.

Pass transistors 22, 24 are selectively turned on or off via word line WL to read or write data from the bit cell via bit lines BIT, $\overline{\text{BIT}}$. The cross-coupled structure of inverters 10, 12 ensures that logically opposite voltages are maintained at first and second storage nodes S1, S2 respectively. To read the single bit value stored in the bit cell, a logic high voltage signal is applied to word line WL, turning pass transistors 22, 24 on, thereby coupling nodes S1, S2 to bit lines BIT, $\overline{\text{BIT}}$ respectively and allowing the bit cell to apply a differential voltage signal to bit lines BIT, $\overline{\text{BIT}}$ which is in turn amplified by sense amplifiers (not shown). The sizes of transistors 14 through 24 are selected to accommodate writing of a single bit value into the bit cell by either pulling bit line BIT and node S1 low to drive node S2 high; or, pulling bit line $\overline{\text{BIT}}$ and node S2 low to drive node S1 high when pass transistors 22, 24 are turned on. The cross coupled inverters latch the new data. Large numbers of such bit cells are combined to form memory arrays.

FIGS. 3 and 4 schematically depict another prior art SRAM bit cell incorporating cross-coupled inverters, as described in U.S. Pat. No. 5,754,468. The FIG. 3 bit cell is similar to the FIG. 1 bit cell, except:

- NMOS pass transistor 24 is replaced with PMOS pass transistor 26;
- word line WL is replaced with a dedicated write enable line and a complementary dedicated read enable line;
- NMOS transistor 22 and PMOS transistor 26 are decoupled from one another—NMOS transistor 22's gate is instead connected to the write enable line and PMOS transistor 26's gate is connected to the complementary read enable line; and,
- bit lines BIT, $\overline{\text{BIT}}$ are replaced with single-ended (true or complement) write and read buses respectively.

In the FIGS. 3 and 4 embodiment, data is written into the bit cell by applying a logic high voltage signal to the write enable line, thereby turning NMOS transistor 22 on and coupling node S1 to the write bus. Data is read from the bit cell by applying a logic low voltage signal to the complementary read enable line, thereby turning PMOS transistor 26 on and coupling node S2 to the read bus, which is preferably pre-charged to a logic low state, since PMOS transistor 26 pulls up better than it pulls down.

The writing of a logic 0 value from the write bus through NMOS transistor 22 into the FIGS. 3 and 4 bit cell is a relatively "strong" event, in the sense that NMOS transistor 22 inherently pulls down to ground, so if a logic 1 value is already stored at node S1 that value is easily overwritten by the logic 0 value. However, the writing of a logic 1 value through NMOS transistor 22 into the FIGS. 3 and 4 bit cell is a relatively "weak" event, in the sense that if a logic 0 value is already stored at node S1, NMOS transistor 22 tends to shut off before the stored logic 0 is overwritten by the logic 1 value. Consequently, the operation of writing of a logic 1 value into the FIGS. 3 and 4 bit cell may fail or require an unacceptably long period of time. One way to compensate for this is to preferentially increase the sizes of the transistors in inverters 10, 12 so that a "weak" logic 1 value driven onto inverter 10's node S2 cross-couples through inverter 12 to complete the writing event at node S1. While this technique can be made to work, the drawback is that larger transistors consume additional integrated circuit silicon area and powder. In a memory array consisting of many cells, the increased silicon area can be considerable.

This invention addresses the foregoing drawbacks of the FIGS. 3 and 4 bit cell, addresses further drawbacks inherent to single-ended bit line cells, and provides novel techniques for splitting rows of cells into 2 or more separate groups.

SUMMARY OF INVENTION

The invention allows efficient writing of data into an SRAM bit cell. In cells configured with separate read and write buses, whenever a write operation is performed, the read bus is forcibly held in a pre-charge state (pulled to ground) during the entire write operation. In cells configured with a common (single-ended) read/write bus, the pass transistor on the side of the cell opposite to the read/write bus is turned on during the entire write operation, reducing the voltage on that side of the cell such that the inverters cross-couple more quickly In either case, this "write assist" feature facilitates the writing of a logic 1 value into the cell without hindering writing of a logic 0 value into the cell. Bits cells formed in accordance with the invention can be replicated in various row arrangements to share write assist circuitry amongst pairs of cells while providing separate read/write mechanisms for each cell in a pair of cells.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Figure 1:
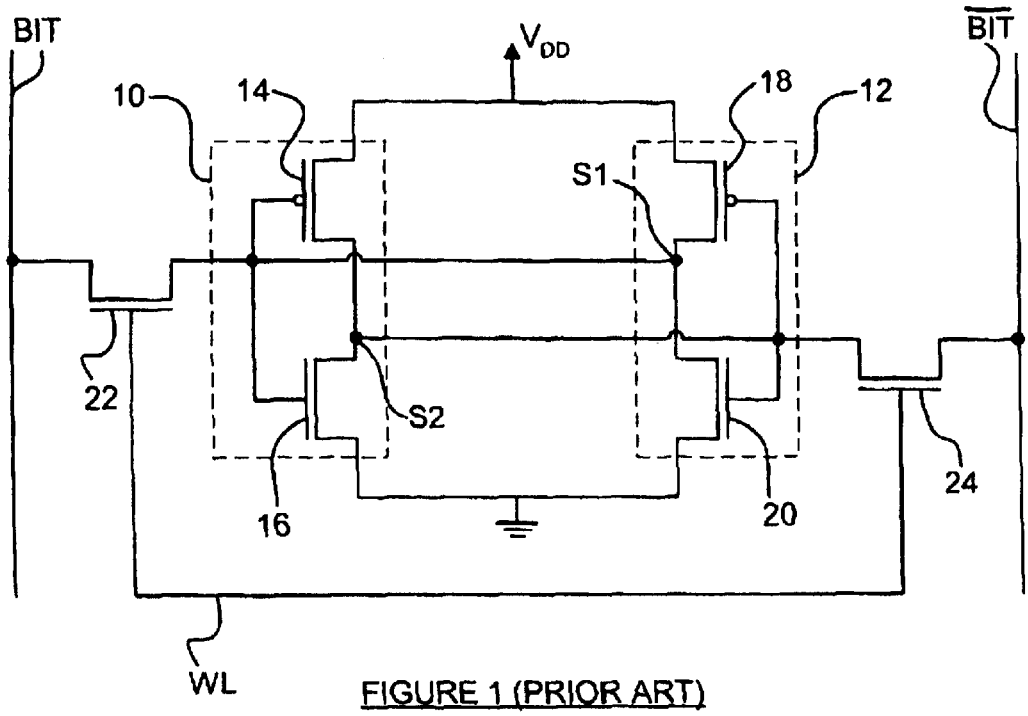
FIGURE 1 (PRIOR ART)
FIG. 1 is a circuit schematic diagram of a first prior art SRAM bit cell.
Figure 2:
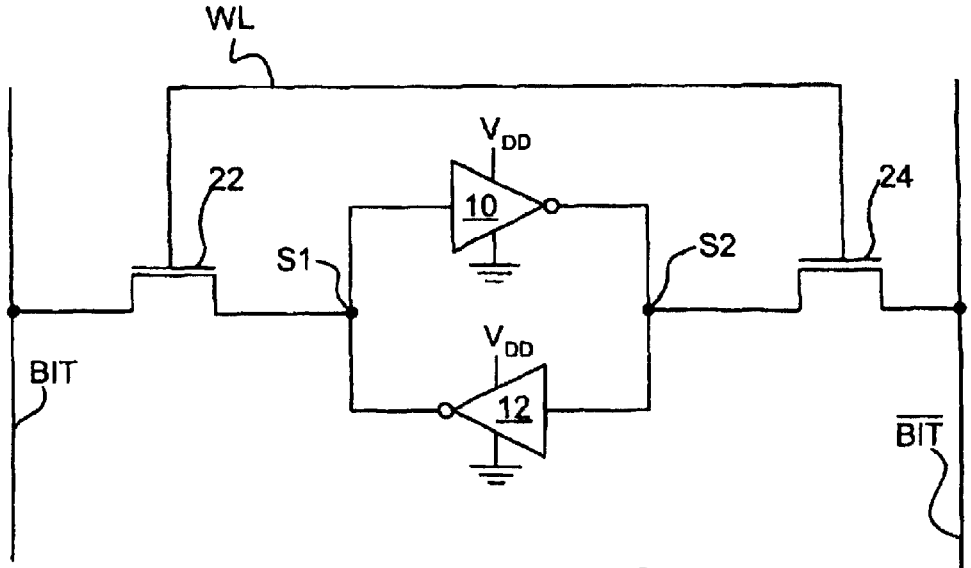
FIGURE 2 (PRIOR ART)
FIG. 2 is a simplified schematic depiction of the FIG. 1 prior art SRAM bit cell.
Figure 3:
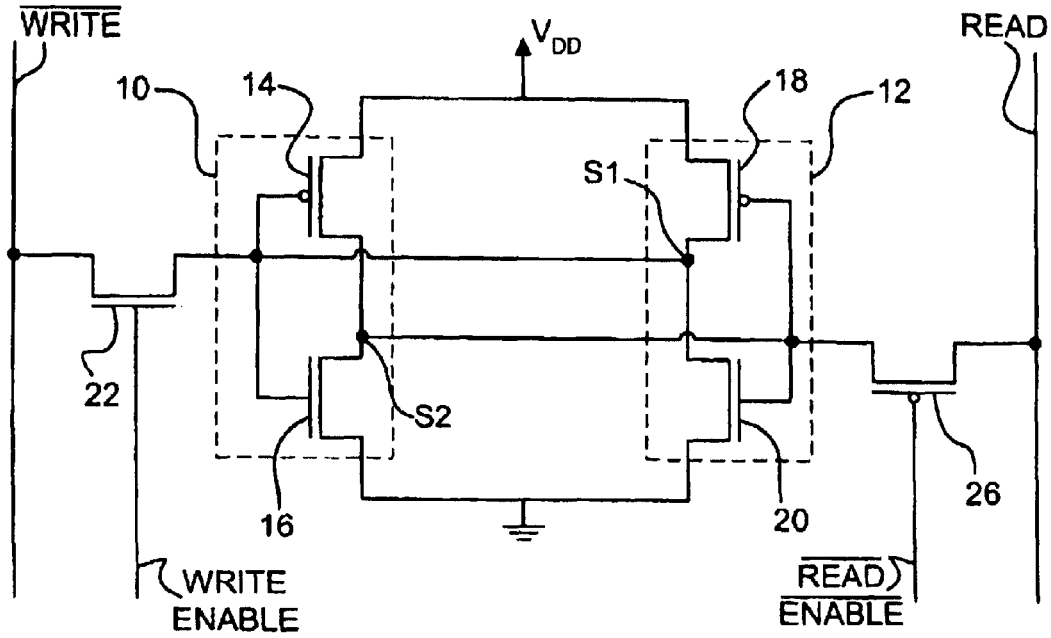
FIGURE 3 (PRIOR ART)
FIG. 3 is a circuit schematic diagram of a second prior art SRAM bit cell.
Figure 4:
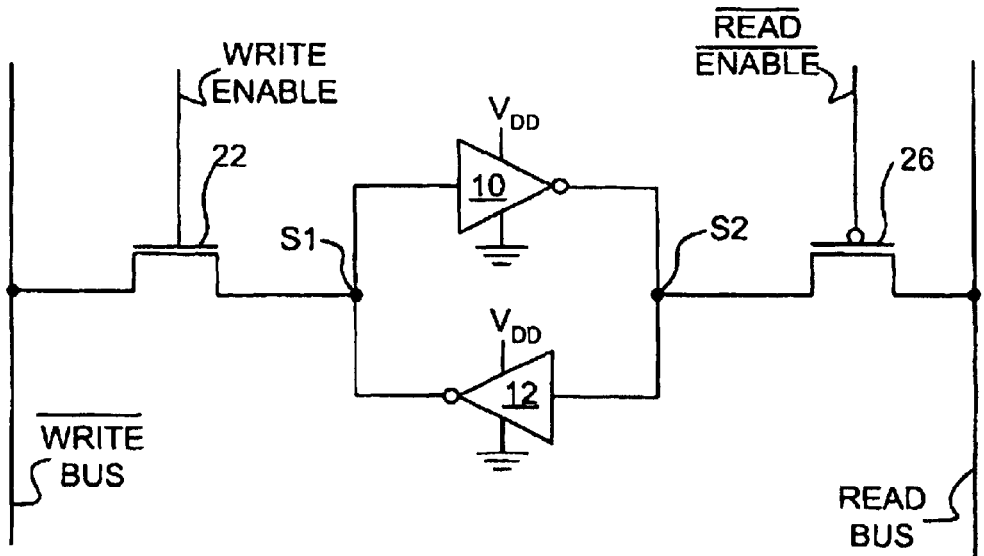
FIGURE 4 (PRIOR ART)
FIG. 4 is a simplified schematic depiction of the FIG. 3 prior art SRAM bit cell.
Figure 5:
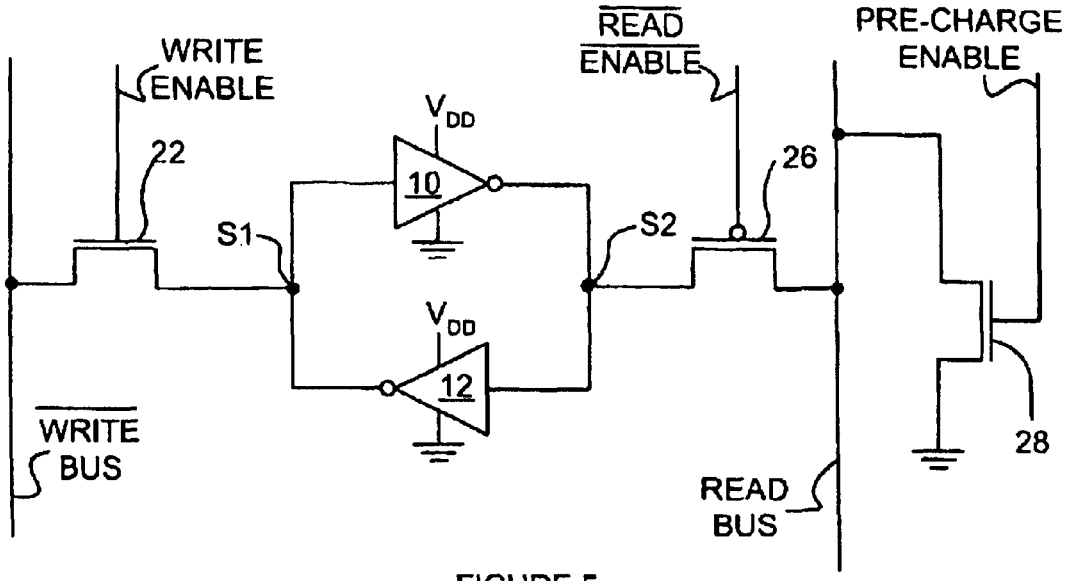
FIG. 5 schematically depicts an SRAM bit cell having a read bus pre-charge transistor in accordance with the invention.

FIG. 5 depicts addition of read bus pre-charge NMOS transistor 28 to the FIGS. 3 and 4 bit cell. Several (i.e. 16–64, or more) SRAM cells are typically connected in parallel along the write and read buses. During a read operation, NMOS transistor 28 is first turned on by applying a logic high voltage signal to the pre-charge enable line, to initialize the read bus by pulling it down to ground. NMOS transistor 28 is then turned off for a brief period of time, allowing the read-selected cell (i.e. selected by turning PMOS transistor 26 on via the read enable line) to pull the read bus towards $V_{DD}$ if a logic 1 value is being held at node S2 (or leave it dynamically at ground potential if a logic 0 value is being held at node S2).

Circuitry (not shown) can be provided to weakly hold the read bus at ground potential. Typically for example, the read bus is connected to sensing circuitry (not shown) having a weak feedback characteristic. If many bit cells are connected to the read bus, when pre-charge NMOS transistor 28 is not turned on leakage currents associated with PMOS transistors may develop, tending to pull the read bus up toward $V_{DD}$. Such leakage can be compensated for in well known fashion to hold the read bus at ground potential. Alternatively, the bit cell can be self-timed as explained below.

Thus, if the read bus is being pulled up towards $V_{DD}$, the voltage at node S2 is pulled down from $V_{DD}$ by a small amount, $\Delta V$, due to current flow through PMOS transistor 26. $\Delta V$ is made sufficiently small that the value stored in the bit cell is not disturbed.

Data is written into the FIG. 5 bit cell by turning NMOS transistor 22, PMOS transistor 26 and NMOS transistor 28 on (i.e. the write cycle is initiated simultaneously with the read cycle). If a logic 1 value is to be written into the bit cell no assistance is required if node S2 is initially at ground potential (i.e. if a logic 1 value is already stored in the bit cell). But, if node S2 is initially at $V_{DD}$ (i.e. if a logic 0 value stored in the bit cell at node S1 is to be overwritten by a logic 1 value), the voltage at node S2 is again reduced by a small (non-constant) amount, $\Delta V$, due to current flow through PMOS transistor 26. This slight voltage reduction at node S2 weakens inverter 12's NMOS transistor 20, such that if a "weak" logic 1 value is written into the bit cell via NMOS transistor 22, the cross-coupling of inverters 10, 12 completes more quickly. An impending transition of node S2 to ground potential is further sped-up because of its lower starting state. Modern integrated circuit fabrication techniques facilitate careful selection of a variety of PMOS transistor 26's operating characteristics (i.e. turn-on voltage threshold, width, etc.) thus facilitating careful control of the voltage at node S2.

It will be noted that, during a read cycle, the pre-charge enable signal is normally already on to initialize the read bus, then turned off for a brief period of time, then turned on again. The pre-charge enable signal remains on at all other times, unless another read cycle is initiated for the bit cell. Thus, the pre-charge enable signal remains on if a write cycle is initiated simultaneously with a read cycle, and is turned off only during a "pure read" cycle (i.e. a read cycle during which no simultaneous write cycle occurs). An important consequence of this pre-charge-assisted write technique is that the sizes of the transistors in inverters 10, 12 do not have to be increased in such a way that the memory cell area is also significantly increased.

Alternatively, instead of turning on both NMOS transistor 22 and PMOS transistor 26 to speed up the write operation, NMOS transistor 22 alone can be turned on and its voltage level boosted above $V_{DD}$ by a small amount. However, this may damage NMOS transistor 22 over long periods of time. This technique also requires more power than the previously described preferred embodiment—which can also be self-timed as explained below. Voltage boosting also requires additional circuitry—it is traditionally used to improve the write performance of dynamic random access memory (DRAM) cells (see for example U.S. Pat. No. 5,103,113) or prior art SRAM cells utilizing single-ended bit line operation.

Figure 6:
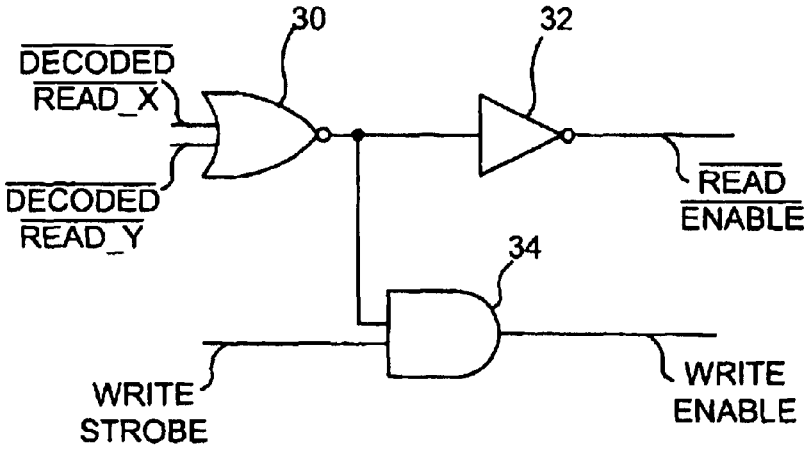
FIG. 6 is a logic diagram of a circuit for generating complementary read and write enable signals from a fully decoded memory read signal gated with a write strobe signal.

FIG. 6 depicts one way of producing properly synchronized, complementary read enable and write enable signals for operating the FIG. 5 bit cell. NOR gate 30 combines pre-decoded read_X and read_Y signals, producing the read enable signal at the output of NOR gate 30. Binary inverter 32 inverts the signal output by NOR gate 30, providing the desired complementary read enable signal. The read enable signal output by NOR gate 30 is also applied to one of AND gate 34's inputs. The "strobed" write enable signal is applied to AND gate 34's other input. The desired write enable signal is consequently output by AND gate 34 in synchronization with the complementary read enable signal output by binary inverter 32. This saves decoder logic in single port memory applications.

Figure 7:
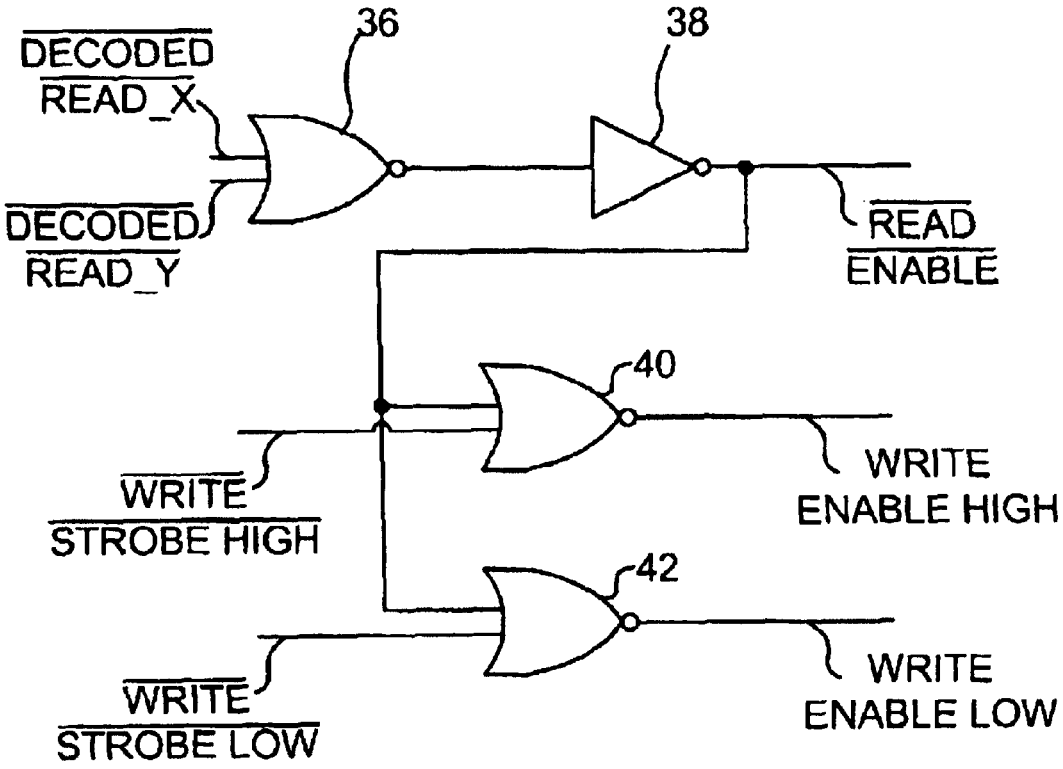
FIG. 7 is a logic diagram of a circuit for generating complementary read, write enable high and write enable low signals from a fully decoded memory read signal gated with a write strobe signal.

A plurality of FIG. 5 type bit cells can be configured to form a 2-part memory. The 2 parts are typically equal in size, and each part has a separate write enable line. One part is labeled "high" and the other part is labeled "low". FIG. 7 shows how to produce properly synchronized, complementary read enable, and write enable high/write enable low signals for operating such a 2-part memory. NOR gate 36 combines pre-decoded read_X and read_Y signals, producing the read enable signal at the output of NOR gate 36. Binary inverter 38 inverts the signal output by NOR gate 36, providing the desired complementary read enable signal. The complementary read enable signal output by inverter 38 is applied to one input of each of NOR gates 40, 42. The "strobed" write enable high signal is applied to the other input of NOR gate 40; and, the "strobed" write enable low signal is applied to the other input of NOR gate 42. The desired write enable high and write enable low signals are consequently output by NOR gates 40, 42 respectively in synchronization with the complementary read enable signal output by inverter 38. Persons skilled in the art will realize that NOR gates 40, 42 can be fabricated to share one of their PMOS transistors, thereby possibly saving silicon area.

In a 2-part memory operated in accordance with FIG. 7, all bit lines are affected by a read, while writing options include: (i) write to both the high and low parts of the memory, (ii) write to only the high part of the memory, or (iii) write to only the low part of the memory. A prior art SRAM "column muxing" technique permits more bits (multiple words) then necessary to be read simultaneously from a memory block, followed by selection (column muxing) of only those bits (i.e. a single word) that are desired. Column muxing can be combined with a "write mask" technique to permit sub-portions of a data word to be modified. This invention does not permit column muxing, but the aforementioned write enable high/write enable low lines facilitate a form of write masking at the primary decoder level.

Figure 8:
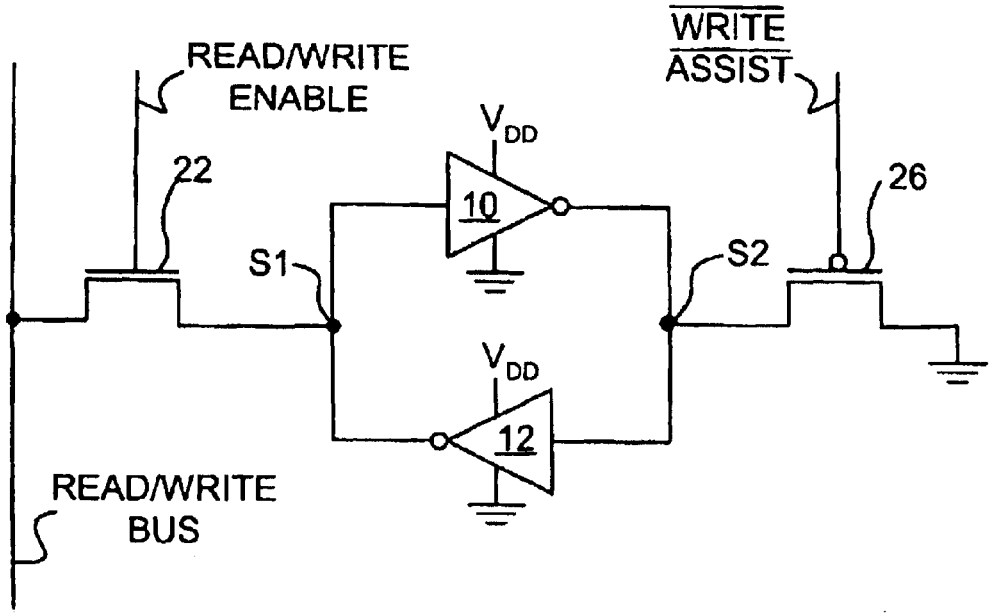
FIG. 8 schematically depicts a single-ended SRAM bit cell having a write-assist feature in accordance with an alternate embodiment of the invention.

FIG. 8 depicts an alternative embodiment of the invention. Unlike the FIG. 5 embodiment, the FIG. 8 embodiment has neither a separate read bus nor a read bus pre-charge transistor. Instead, a dual-purpose (single-ended) read/write bus is provided, and PMOS transistor 26's source is grounded. In a single-ended bit cell like that of FIG. 8, NMOS transistor 22 tends to turn off if a logic 1 value is driven onto the read/write bus for storage in the bit cell. This allows the voltage at node S1 to rise, preventing the bit cell's inverters from cross-coupling to "flip" the cell from a logic 0 value to a logic 1 value.

Consequently, after an attempt to overwrite a previously stored logic 0 value with a logic 1 value, the bit cell may flip back from a logic 1 value to a logic 0 value after completion of the write cycle. The FIG. 8 embodiment circumvents this problem.

Specifically, during a write operation, in which it is desired to change the logic state at node S1 to a specific (high or low) logic level, the desired logic level is driven onto the read/write bus. PMOS transistor 26 is turned on during the write operation by applying a write assist signal to PMOS transistor 26's gate. As previously explained in relation to the FIG. 5 embodiment, if a logic 1 value is to be written into the bit cell no assistance is required if node S2 is initially at ground potential (i.e. if a logic 1 value is already stored in the bit cell). But, if node S2 is initially at $V_{DD}$ (i.e. if a logic 0 value stored in the bit cell at node S1 is to be overwritten by a logic 1 value), current flow through PMOS transistor 26 reduces the voltage at node S2 such that the inverters cross-couple more quickly.

During a read operation, the read/write bus is initially pre-charged (through a gated pull-up transistor—not shown) to a voltage equal to or approximately equal to $V_{DD}$ and NMOS transistor 22 is subsequently turned on by applying a read/write enable signal to NMOS transistor 22's gate. Thereafter, the logic level on the read/write bus is determined by the logic level of node S1. That is, the read/write bus remains at $V_{DD}$ if node S1 is at $V_{DD}$; or, the read/write bus is pulled down to ground if node S1 is at ground potential. As in the case of the FIG. 5 embodiment, turning on PMOS transistor 26 does not in itself cause any storage state changes in the cell.

An advantage of the FIG. 8 embodiment over the FIG. 5 embodiment is that it is unnecessary to boost the voltage of read/write enable signal above $V_{DD}$ to speed up the write operation, because both NMOS transistor 22 and PMOS transistor 26 are turned on during the write operation.

Figure 9:
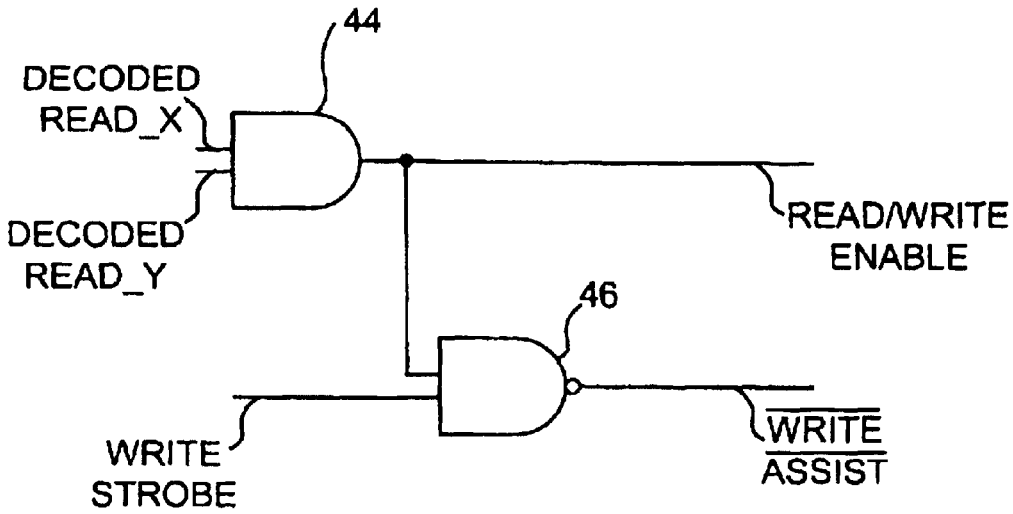
FIG. 9 is a logic diagram of a circuit for generating read/write enable and write assist signals for the FIG. 8 bit cell.

FIG. 9 depicts one way of adapting the FIG. 6 circuit to produce properly synchronized, complementary read/write enable and write assist signals for operating the FIG. 8 bit cell. AND gate 44 combines pre-decoded read_X and read_Y signals, producing the read/write enable signal at the output of AND gate 44. The read/write enable signal output by AND gate 44 is also applied to one of NAND gate 46's inputs. The write "strobe" signal is applied to NAND gate 46's other input. The desired complementary write assist signal is output by NAND gate 46 in synchronization with the read/write enable signal output by AND gate 44. The FIG. 7 circuit can be similarly adapted to operate a plurality of FIG. 8 type bit cells configured to form a 2-part memory.

Figure 10:
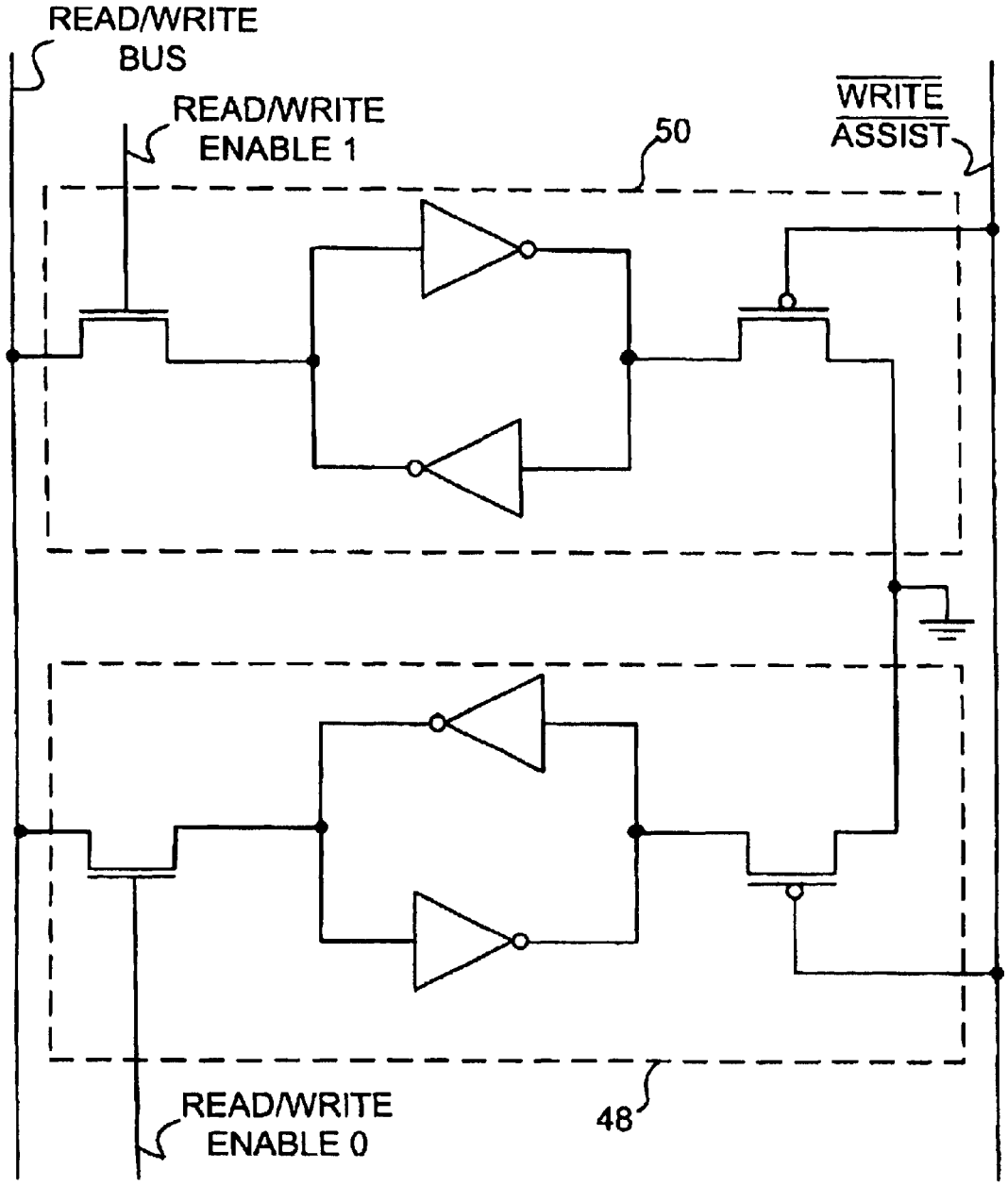
FIG. 10 schematically depicts a pair of FIG. 8 type bit cells connected to share a common read/write bus and a common write-assist signal.

FIG. 10 depicts one way of replicating the FIG. 8 bit cell. A pair of FIG. 8 type bit cells 48, 50 are connected in parallel between a common read/write bus and a common write assist line. Reading or writing operations affecting bit cells 48, 50 respectively are controlled via mutually exclusive "read/write enable 0" and "read/write enable 1" lines. Thus, although signals applied to the write assist line affect both cells, only one cell can be written to at any particular time, as determined by the logic values applied to the mutually exclusive read/write enable lines. Similarly, only one cell can be read from at any particular time. Such shared usage of the write assist line simplifies circuit layout, thereby reducing silicon area consumption, at the expense of a small amount of power. The FIG. 9 circuit is readily adapted to produce properly synchronized, mutually exclusive read/write enable and write assist signals for operating the FIG. 10 bit cell.

More particularly, the FIG. 10 embodiment facilitates construction of a memory array having a plurality of pairs of bit cells 48, 50. Each pair of bit cells has first and second inverters cross-coupled to define first and second storage nodes, a first pass transistor coupled between the read/write bus and the first storage node, and a second pass transistor coupled between a logic low voltage referencing signal source and the second storage node. The first pass transistor is coupled to the read/write enable 1 line for controllably switching the first pass transistor on or off. The second pass is transistor coupled to the write assist line for controllably switching the second pass transistor on or off. One of the first and second pass transistors (preferably the first) in an NMOS transistor and the other one of the first and second pass transistors (preferably the second) is a PMOS transistor.

Each pair of bit cells also has third and fourth inverters cross-coupled to define third and fourth storage nodes, a third pass transistor coupled between the read/write bus and the third storage node, and a fourth pass transistor coupled between the logic low voltage reference signal source and the fourth storage node. The third pass transistor is coupled to the read/write enable 0 line for controllably switching the third pass transistor on or off. The fourth pass transistor is coupled to the write assist line for controllably switching the fourth pass transistor on or off. One of the third and fourth pass transistors (preferably the third) is an NMOS transistor and the other one of the third and fourth pass transistors (preferably the fourth) is a PMOS transistor.

Figure 11:
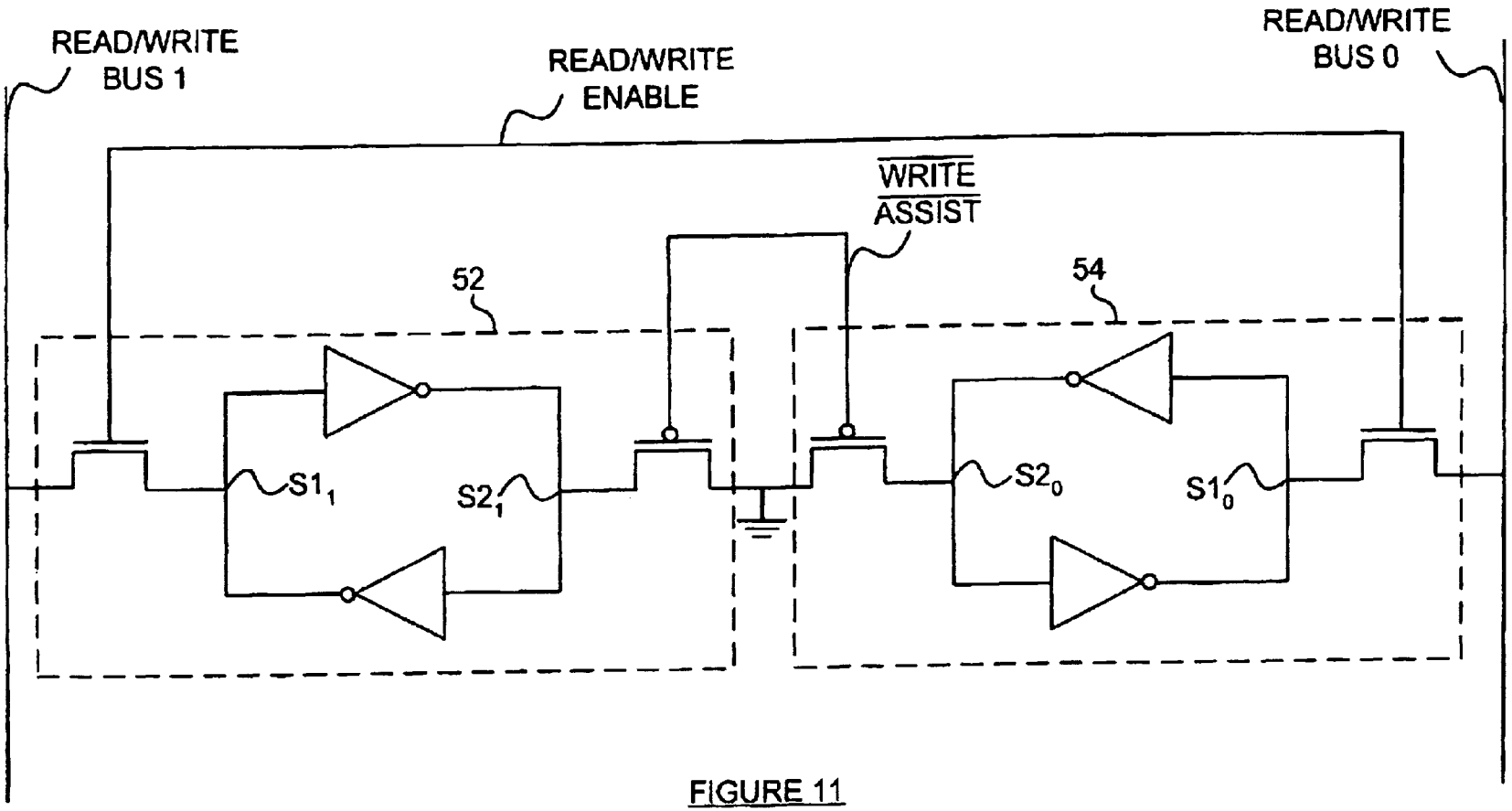
FIG. 11 schematically depicts a pair of FIG. 8 type bit cells connected to separate read/write buses and sharing a common write-assist signal.

FIG. 11 depicts a second way of replicating the FIG. 8 bit cell. A pair of FIG. 8 type bit cells 52, 54 sharing a common write assist line and a common read/write enable line are connected in series between separate read/write buses. Reading or writing operations affecting bit cells 52, 54 are controlled via the common read/write enable line. Although signals applied to the write assist or read/write enable lines affect both cells, the cells operate independently by virtue of their coupling to different read/write buses. Such shared usage of the write assist and read/write enable lines further simplifies circuit layout.

More particularly, the FIG. 11 embodiment facilitates construction of a memory array having a plurality of pairs of bit cells 52, 54. Each pair of bit cells has first and second inverters cross-coupled to define first and second storage nodes $S1_1$, $S1_2$; a first pass transistor coupled between read/write bus 1 and $S1_1$, and a second pass transistor coupled between a logic low voltage reference signal source and $S2_1$. The first pass transistor is coupled to the read/write enable line for controllably switching the first pass transistor on or off. The second pass transistor is coupled to the write assist line for controllably switching the second pass transistor on or off. One of the first and second pass transistors (preferably the first) is an NMOS transistor and the other one of the first and second pass transistors (preferably the second) is a PMOS transistor. Each pair of bit cells also has third and fourth inverters cross-coupled to define third and fourth storage nodes $S2_0$, $S1_0$; a third pass transistor coupled between read/write bus 0 and $S1_0$, a fourth pass transistor coupled between the logic low voltage reference signal source and $S2_0$. The third pass transistor is coupled to the read/write enable line for controllably switching the third pass transistor on or off. The fourth pass transistor is coupled to the write assist line for controllably switching the fourth pass transistor on or off. One of the third and fourth pass transistors (preferably the third) is an NMOS transistor and the other one of the third and fourth pass transistors (preferably the fourth) is a PMOS transistor.

Figure 12:
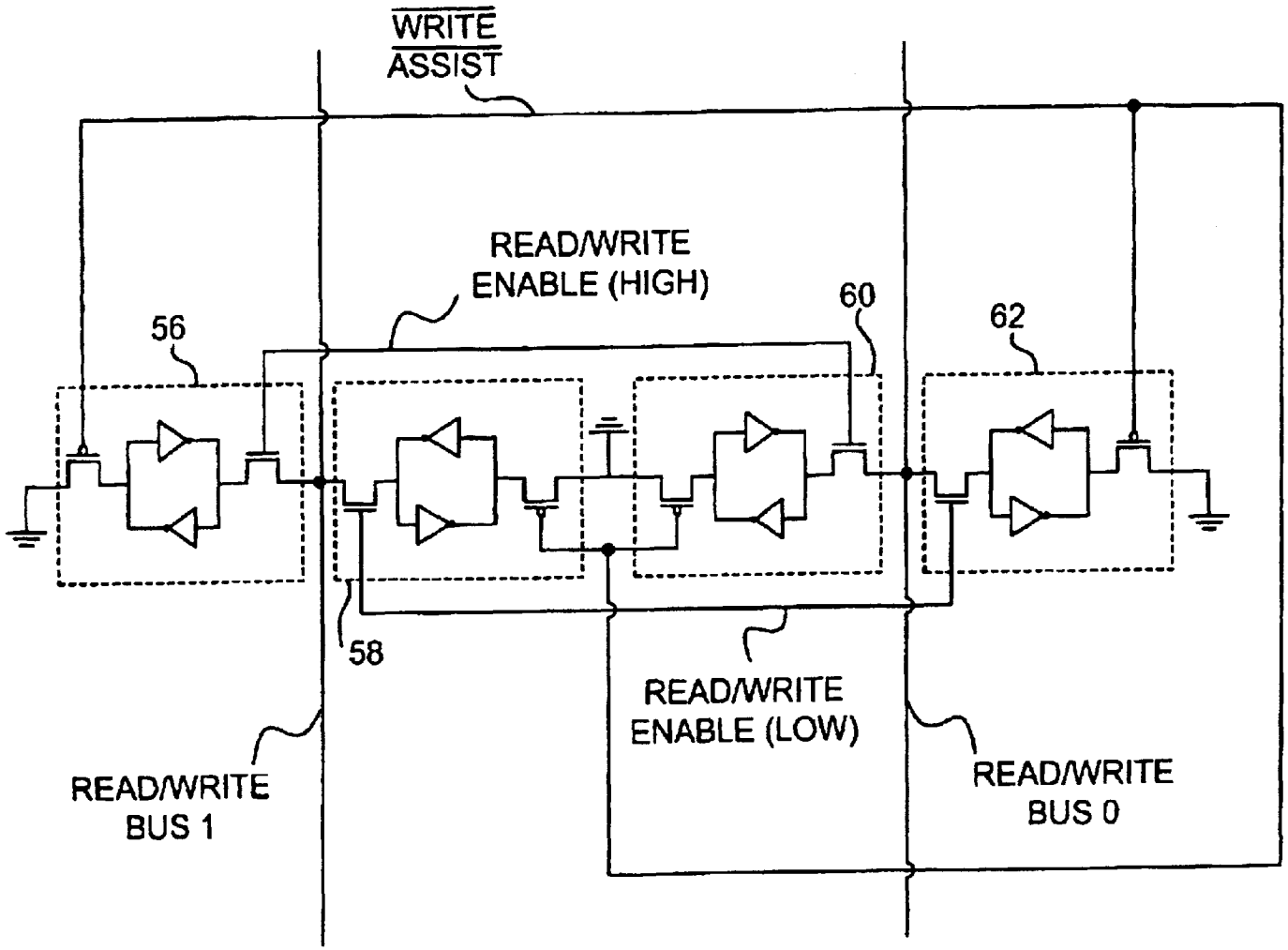
FIG. 12 schematically depicts interleaved pairs of FIG. 8 type bit cells sharing a common write-assist signal.

FIG. 12 depicts a third way of replicating the FIG. 8 bit cell. Four FIG. 8 type bit cells 56, 58, 60, 62 sharing a common write assist line are connected in series to form a 2-part memory. Bit cells 56, 60 constitute the "high" part of the memory; bit cells 58, 62 constitute the "low" part of the memory. Reading or writing operations affecting bit cells 56, 60 are controlled via a common "read/write enable (high)" line. Reading or writing operations affecting bit cells 58, 62 are controlled via a common "read/write enable (low)" line which is separate from the read/write enable (high) line. Note that replication of FIG. 5 type bit cells to form a 2-part memory requires 3 separate control lines (i.e. high and low write enable lines and a read enable line) to be run over top of a possibly narrow cell pitch. By contrast, replication of FIG. 8 type bit cells to form a 2-part memory as shown in FIG. 12 requires only 2½ separate lines per cell, because each write assist line is shared by 2 bit cells (in a memory array consisting of many cells, each write assist line is shared by 2 columns of bit cells).

More particularly, the FIG. 12 embodiment facilitates construction of a memory array having a plurality of quadruplets of bit cells 56, 58, 60, 62. Each quadruplet has first and second inverters cross-coupled to define first and second storage nodes, a first pass transistor coupled between read/write bus 1 and the first storage node, and a second pass transistor coupled between a logic low voltage reference signal source and the second storage node. The first pass transistor is coupled to the read/write enable (high) line for controllably switching the first pass transistor on or off. The second pass transistor is coupled to the write assist line for controllably switching the second pass transistor on or off. Once of the first and second pass transistors (preferably the first) is an NMOS transistor and the other one of the first and second pass transistors (preferably the second) is a PMOS transistor. Each quadruplet also has third and fourth inverters cross-coupled to define third and fourth storage nodes, a third pass transistor coupled between read/write bus 1 and the third storage node, and a fourth pass transistor coupled between the logic low voltage reference signal source and the fourth storage node. The third pass transistor is coupled to the read/write enable (low) line for controllably switching the third pass transistor on or off. The fourth pass transistor is coupled to the write assist line for controllably switching the fourth pass transistor on or off. One of the third and fourth pass transistors (preferably the third) is an NMOS transistor and the other one of the third and fourth pass transistors (preferably the fourth) is a PMOS transistor. Each quadruplet also has fifth and sixth inverters cross-coupled to define fifth and sixth storage nodes, a fifth pass transistor coupled between read/write bus 0 and the fifth storage node, and a sixth pass transistor coupled between the logic low voltage reference signal source and the sixth storage node. The fifth pass transistor is coupled to the read/write enable (high) line for controllably switching the fifth pass transistor on or off. The sixth pass transistor is coupled to the write assist line for controllably switching the sixth pass transistor on or off. One of the fifth and sixth pass transistors (preferably the fifth) is an NMOS transistor and the other one of the fifth and sixth pass transistors (preferably the sixth) is a PMOS transistor. Each quadruplet also has seventh and eighth inverters cross-coupled to define seventh and eighth storage nodes, a seventh pass transistor coupled between read/write bus 0 and the seventh storage node, and an eighth pass transistor coupled between the logic low voltage reference signal source and the eighth storage node. The seventh pass transistor is coupled to the read/write enable (low) line for controllably switching the seventh pass transistor on or off. The eighth pass transistor is coupled to the write assist line for controllably switching the eighth pass transistor on or off. One of the seventh and eighth pass transistors (preferably the seventh) is an NMOS transistor and the other one of the seventh and eighth pass transistors (preferably the eighth) is a PMOS transistor.

The FIGS. 11 and 12 embodiments provide a "double density" row arrangement of bit cells, in contrast to the FIG. 10 embodiment's "single density" row arrangement, since the FIG. 11 and 12 embodiments each accommodate twice as many bit cells per read/write bus as the FIG. 10 embodiment. This could be beneficial when larger arrays of cells are desired, and also helps reduce silicon area when the row width is not large (e.g. fewer than 32 bits). Another advantage of the FIG. 12 embodiment is that both reading and writing operations involve the same number of bits, whereas reading a 2-part memory formed of FIG. 5 type bit cells may involve twice as many bits as writing such a memory, (i.e. since writing involves only 1 of the memory's 2 parts).

As will be apparent to those skilled in the art in the light of the foregoing disclosure, many alterations and modifications are possible in the practice of this invention without departing from the spirit or scope thereof. For example, FIGS. 5 and 6 pertain to a single-port memory embodiment of the invention. Additional ports can be added by duplicating NMOS transistor 22 and PMOS transistor 26 and their respectively associated write and read buses. As another example, the FIGS. 6 and 7 circuits can be adapted to operate various embodiments of the invention. As a further example, the FIG. 8 write assist signal can additionally be applied to PMOS transistor PMOS 20's source terminal (instead of grounding that terminal), since the write assist signal is an "active low" signal. As a still further example, in the FIGS. 5 and 8 embodiments, either one of pass transistors 22, 26 may be an NMOS transistor, with the other one of those transistors being a PMOS transistor, although pass transistor 22 is preferably an NMOS transistor and pass transistor 26 is preferably an PMOS transistor. The scope of the invention is to be construed in accordance with the substance defined by the following claims.

What is claimed is:

1. A memory bit cell comprising cross-coupled first and second inverters, each one of the inverters further comprising a pull-up transistor and a pull-down transistor having series-connected terminals defining a storage node, a first pass transistor coupled between a write bus and a first one of the storage nodes, a second pass transistor coupled between a read bus and a second one of the storage nodes, the first pass transistor further coupled to a write enable line for controllably switching the first pass transistor on or off, the second pass transistor further coupled to a read enable line for controllably switching the second pass transistor on or off, and a pre-charge transistor coupled between the read bus and a logic low voltage reference signal source, wherein one of the first and second pass transistors is an NMOS transistor and the other one of the first and second pass transistors is a PMOS transistor.

2. A bit cell as defined in claim 1, wherein:

(a) the pull-down transistors, the first pass transistor and the pre-charge transistor are NMOS transistors; and, (b) the pull-up transistors and the second pass transistor are PMOS transistors.

3. A bit cell as defined in claim 2, wherein the series-connected terminals further comprise drain terminals of the respective inverter pull-down transistors, a logic high voltage reference signal is applied to a source terminal of each one of the pull-up transistors, the logic low voltage reference signal is applied to a source terminal of each one of the pull-down transistors, a switching terminal of the first inverter pull-up transistor is coupled to a switching terminal of the first inverter pull-down transistor, a switching terminal of the second inverter pull-up transistor is coupled to a switching terminal of the second inverter pull-down transistor, the first inverter pull-up and pull-down transistor switching terminals are further coupled to the second inverter series-connected terminals, the second inverter pull-up and pull-down transistor switching terminals are further coupled to the first inverter series-connected terminals, a source-to-drain path of the first pass transistor is coupled between the write bus and the first storage node, a source-to-drain path of the second pass transistor is coupled between the read bus and the second storage node, a source-to-drain path of the pre-charge transistor is coupled between the read bus and the logic low voltage reference signal source, a switching terminal of the first pass transistor is coupled to the write enable line, a switching terminal of the second pass transistor is coupled to the read enable line, and a switching terminal of the pre-charge transistor is coupled to a pre-charge enable line.

4. A bit cell as defined in claim 3, further comprising circuitry for:

(a) logically combining decoded X and Y read signals to produce a read enable signal;

(b) logically inverting the read enable signal to produce a complementary read enable signal;

(c) applying the complementary read enable signal to the read enable line to turn the second pass transistor on;

(d) logically combining a write strobe signal when the read enable signal to produce a write enable signal;

(e) applying the write enable signal to the write enable line to turn the first pass transistor on;

(f) if the pre-charge transistor is off, applying a pre-charge enable signal to the pre-charge enable line to turn the pre-charge transistor on; and, (g) if the pre-charge transistor is on, applying the pre-charge enable signal to the pre-charge enable line to keep the pre-charge transistor turned on;

while simultaneously:

(i) writing data on the write bus into the bit cell;

(ii) reading data from the bit cell onto the read bus; and, (iii) maintaining the read bus in a logic low state.

5. A bit cell as defined in claim 4, the driver for further:

(a) applying a logical complement of the write enable signal to the write enable line to turn the first pass transistor off;

(b) applying the complementary read enable signal to the read enable line to turn the second pass transistor on; and, (c) initially applying the pre-charge enable signal to the pre-charge enable line to initially turn the pre-charge transistor on, then applying a logical complement of the pre-charge enable signal to the pre-charge enable line to turn the pre-charge transistor off for a brief time interval, then applying the pre-charge enable signal to the pre-charge enable line to turn the pre-charge transistor on;

while reading data from the bit cell onto the read bus without simultaneously writing data on the write bus into the bit cell.

6. A multiple-row and multiple-column memory array comprising a plurality of bit cells, each one of the bit cells further comprising first and second inverters cross-coupled to define first and second storage nodes, a first pass transistor coupled between a write bus and the first storage node, a second pass transistor coupled between a read bus and the second storage node, the first pass transistor further coupled to a write enable line for controllably switching the first pass transistor on or off, the second pass transistor further coupled to a read enable line for controllably switching the second pass transistor on or off, one of the first and second pass transistors being an NMOS transistor and the other one of the first and second pass transistors being a PMOS transistor, wherein each write bus is grouped into one of[:]

[(i)] a plurality of high memory parts[;] and[.]

[(ii)] a plurality of low memory parts*;* the memory array further comprising, for each read bus, a pre-charge transistor coupled between the read bus and a logic low voltage reference signal source.

7. A memory array as defined in claim 6, wherein:

(a) the first inverter further comprises a first pull-up transistor and a first pull-down transistor having series-connected terminals defining the first storage node;

(b) the second inverter further comprises a second pull-up transistor and a second pull-down transistor having series-connected terminals defining the second storage node;

(c) the pull-down transistors, the first pass transistors and the pre-charge transistor are NMOS transistors; and, (d) the pull-up transistors and the second pass transistors are PMOS transistors.

8. A memory array as defined in claim 7, wherein the series-connected terminals further comprise drain terminals of the respective inverter pull-up and pull-down transistors, the logic high voltage reference signal is applied to a source terminal of each one of the pull-up transistors, the logic low voltage reference signal is applied to a source terminal of each one of the pull-down transistors, a switching terminal of the first inverter pull-up transistor is coupled to a switching terminal of the first inverter pull-up transistor, a switching terminal of the second inverter pull-up transistor is coupled to a switching terminal of the second inverter pull-down transistor, the first inverter pull-up and pull-down transistor switching terminals are further coupled to the second inverter series-connected terminals, the second inverter pull-up and pull-down transistor switching terminals are further coupled to the first inverter series-connected terminals, a source-to-drain path of the first pass transistor is coupled between the write bus and the first voltage node, a source-to-drain path of the second transistor is coupled between the read bus and the second storage node, a source-to-drain path of the pre-charge transistor is coupled between the read bus and the logic low voltage reference signal source, a switching terminal of the first pass transistor is coupled to the write enable line, a switching terminal of the second pass transistor is coupled to the read enable line, a switching terminal of the pre-charge transistor is coupled to a pre-charge enable line.

9. A memory array as defined in claim 8, the driver for further:

(a) applying a logical complement of the write enable signal to the write enable line to turn off the first pass transistor in each bit cell in the row;

(b) applying the complementary read enable signal to the read enable line to turn on the second pass transistor in each bit cell in the row;

(c) for each pre-charge transistor coupled to the row:

(i) initially applying the pre-charge enable signal to the pre-charge transistor to initially turn the pre-charge transistor on;

(ii) then applying a logical complement of the pre-charge enable signal to the pre-charge transistor for a brief time interval to turn the pre-charge transistor off for the brief time interval; and, (iii) then applying the pre-charge enable signal to the pre-charge transistor to turn the pre-charge transistor on;

while reading data from each bit cell in the row onto the read bus without simultaneously writing data on the write bus into each bit cell in the row.

10. A memory array as defined in claim 6, further comprising, for each row, a driver for:

(a) logically combining decoded X and Y read signals to produce a read enable signal;

(b) logically inverting the read enable signal to produce a complementary read enable signal;

(c) applying the complementary read enable signal to the read enable line to turn on the second pass transistor in each bit cell in the row;

(d) logically combining a write strobe signal when the read enable signal to produce a write enable signal;

(e) applying the write enable signal to the write enable line to turn on the first pass transistor in each bit cell in the row;

(f) for each pre-charge transistor coupled to the row:

(i) if the pre-charge transistor is off, applying a pre-charge enable signal to the pre-charge transistor to turn the pre-charge transistor on; and, (ii) if the pre-charge transistor is on, applying the pre-charge enable signal to the pre-charge transistor to keep the pre-charge transistor turned on;

while simultaneously writing data on the write bus into each bit cell in the row and reading data from each bit cell in the row onto the read bus.

11. A method of writing a binary digital value asserted on a write bus into a memory bit cell, the bit cell comprising first and second inverters cross-coupled to define first and second storage nodes, a first pass transistor coupled between the write bus and the first storage node, a second pass transistor coupled between a read bus and the second storage node, the first pass transistor further coupled to a write enable line for controllably switching the first pass transistor on or off, the second pass transistor further coupled to a read enable line for controllably switching the second pass transistor on or off, and a pre-charge transistor coupled between the read bus and a logic low voltage reference signal source, the method comprising:

(a) turning the first pass transistor on;

(b) turning the second pass transistor on;

(c) if the pre-charge transistor is off, turning the pre-charge transistor on; and, (d) if the pre-charge transistor is on, keeping the pre-charge transistor turned on.

12. A method of reading onto a read bus a binary digit value stored in a memory bit cell, the bit cell comprising first and second inverters cross-coupled to define first and second storage nodes, a first pass transistor coupled between the write bus and the first storage node, a second pass transistor coupled between a read bus and the second storage node, the first pass transistor further coupled to a write enable line for controllably switching the first pass transistor on or off, the second pass transistor further coupled to a read enable line for controllably switching the second pass transistor on or off, a pre-charge transistor coupled between the read bus and a logic low voltage reference signal source, the method comprising:

(a) turning the first pass transistor off;

(b) turning the second pass transistor on; and, (c) initially turning the pre-charge transistor on, then turning the pre-charge transistor off for a brief time interval, then turning the pre-charge transistor on.

13. A memory bit cell comprising first and second inverters cross-coupled to define first and second storage nodes, a first pass transistor coupled between a read/write bus and the first storage node, a second pass transistor coupled between a logic low voltage reference signal source and the second storage node, the first pass transistor further coupled to a read/write enable line for controllably switching the first pass transistor on or off, the second pass transistor further coupled to a write assist line for controllably switching the second pass transistor on or off, wherein one of the first and second pass transistors is an NMOS transistor and the other one of the first and second pass transistors is a PMOS transistor.

14. A bit cell as defined in claim 13, wherein:

(a) the first inverter further comprises a first pull-up transistor and a first pull-down transistor having series-connected terminals defining the first storage node;

(b) the second inverter further comprises a second pull-up transistor and a second pull-down transistor having series-connected terminals defining the second storage node;

(c) the pull-down transistors and the first pass transistor are NMOS transistors; and, (d) the pull-up transistors and the second pass transistor are PMOS transistors.

15. A bit cell as defined in claim 14, wherein the series-connected terminals further comprise drain terminals of the respective inverter pull-up and pull-down transistors, a logic high voltage reference signal is applied to a source terminal of each one of the pull-up transistors, the logic low voltage reference signal is applied to a source terminal of each one of the pull-down transistors, a switching terminal of the first inverter pull-up transistor is coupled to a switching terminal of the first inverter pull-down transistor, a switching terminal of the second inverter pull-up transistor is coupled to a switching terminal of the second inverter pull-down transistor, the first inverter pull-up and pull-down transistor switching terminals are further coupled to the second inverter series-connected terminals, the second inverter pull-up and pull-down transistor switching terminals are further coupled to the first inverter series-connected terminals, a source-to-drain path of the first pass transistor is coupled between the read/write bus and the first storage node, a source-to-drain path of the second pass transistor is coupled between the logic low voltage reference signal source and the second storage node, a switching terminal of the first pass transistor is coupled to the read/write enable line, and a switching terminal of the second pass transistor is coupled to the write assist line.

16. A bit cell as defined in claim 15, further comprising circuitry for:

(a) logically combining decoded X and Y read signals to produce a read/write enable signal;

(b) applying the read/write enable signal to the read/write enable line to turn the first pass transistor on;

(c) logically combining a write strobe signal with the read/write enable signal to produce a write assist signal; and, (d) applying the write assist signal to the write assist line to turn the second pass transistor on;

while either:

(i) writing data on the read/write bus into the bit cell; or, (ii) reading data from the bit cell onto the read/write bus.

17. A multiple-row and multiple-column memory array comprising a plurality of bit cells, each bit cell comprising first and second inverters cross-coupled to define first and second storage nodes, a first pass transistor coupled between a read/write bus and the first storage node, a second pass transistor coupled between a logic low voltage reference signal source and the second storage node, the first pass transistor further coupled to a read/write enable line for controllably switching the first pass transistor on or off, the second pass transistor further coupled to a write assist line for controllably switching the second pass transistor on or off, one of the first and second pass transistors being an NMOS transistor and the other one of the first and second pass transistors being a PMOS transistor, wherein each read/write enable line is grouped into one of:

(i) a plurality of high memory parts; and, (ii) a plurality of low memory parts.

18. A memory array as defined in claim 17, wherein:

(a) the first inverter further comprises a first pull-up transistor and a first pull-down transistor having series-connected terminals defining the first storage node;

(b) the second inverter further comprises a second pull-up transistor and a second pull-down transistor having series-connected terminals defining the second storage node;

(c) the pull-down transistors and the first pass transistors are NMOS transistors; and, (d) the pull-up transistors and the second pass transistors are PMOS transistors.

19. A memory array as defined in claim 18, wherein the series-connected terminals further comprise drain terminals of the respective inverter pull-up and pull-down transistors, the logic high voltage reference signal is applied to a source terminal of each one of the pull-up transistors, the logic low voltage reference signal is applied to a source terminal of each one of the pull-down transistors, a switching terminal of the first inverter pull-up transistor is coupled to a switching terminal of the first inverter pull-down transistor, a switching terminal of the second inverter pull-up transistor is coupled to a switching terminal of the second inverter pull-down transistor, the first inverter pull-up and pull-down transistor switching terminals are further coupled to the second inverter series-connected terminals, the second inverter pull-up and pull-down transistor switching terminals are further coupled to the first inverter series-connected terminals, a source-to-drain path of the first pass transistor is coupled between the read/write bus and the first storage node, a source-to-drain path of the second transistor is coupled between the logic low voltage reference signal source and the second storage node, a switching terminal of the first pass transistor coupled to the read/write enable line, and a switching terminal of the second pass transistor is coupled to the write assist line.

20. A memory array as defined in claim 17, further comprising, for each row, a driver for:

(a) logically combining decoded X and Y read signals to produce a read/write enable signal;

(b) applying the read/write enable signal to the read/write enable line to turn on the first pass transistor in each bit cell in the row;

(c) logically combining a write strobe signal with the read/write enable signal to produce a write assist signal; and, (d) applying the write assist signal to the write assist line to turn the second pass transistor in each bit cell in the row;

while either:

(i) writing data on the read/write bus into the bit cell; or, (ii) reading data from the bit cell onto the read/write bus.

21. A method of writing a binary digital value asserted on a read/write bus into a memory bit cell, the bit cell comprising first and second inverters cross-coupled to define first and second storage nodes, a first pass transistor coupled between the read/write bus and the first storage node, a second pass transistor coupled between a logic low voltage reference signal source and the second storage node, the first pass transistor further coupled to a read/write enable line for controllably switching the first pass transistor on or off, the second pass transistor further coupled to a write assisted line for controllably switching the second pass transistor on or off, the method comprising turning the first and second pass transistors on.

22. A method of reading onto a read/write bus a binary digit value stored in a memory bit cell, the bit cell comprising first and second inverters cross-coupled to define first and second storage nodes, a first pass transistor coupled between the read/write bus and the first storage node, a second pass transistor coupled between a logic low voltage reference signal source and the second storage node, the first pass transistor further coupled to a read/write enable line for controllably switching the first pass transistor on or off, the second pass transistor further coupled to a write assist line for controllably switching the second pass transistor on or off, the method comprising turing the first pass transistor on and turning the second pass transistor off.

23. A memory array comprising a plurality of pairs of bit cells, each pair of bit cells further comprising:

(a) first and second inverters cross-coupled to define first and second storage nodes, a first pass transistor coupled between a read/write bus and the first storage node, a second pass transistor coupled between a logic low voltage reference signal source and the second storage node, the first pass transistor further coupled to a first read/write enable line for controllably switching the first pass transistor on or off, the second pass transistor further coupled to a write assist line for controllably switching the second pass transistor on or off, one of the first and second pass transistors being an NMOS transistor and the other one of the first and second pass transistors being a PMOS transistor; and, (b) third and fourth inverters cross-coupled to define third and fourth storage nodes, a third pass transistor coupled between the read/write bus and the third storage node, a fourth pass transistor coupled between the logic low voltage reference signal source and the fourth storage node, the third pass transistor further coupled to a second read/write enable line for controllably switching the third pass transistor on or off, the fourth pass transistor further coupled to the write assist line for controllably switching the fourth pass transistor on or off, one of the third and fourth pass transistors being an NMOS transistor and the other one of the third and fourth pass transistors being a PMOS transistor.

24. A memory array as defined in claim 23, wherein the first and third pass transistors are NMOS transistors and the second and fourth pass transistors are PMOS transistors.

25. A memory array comprising a plurality of pairs of bit cells, each pair of bit cells further comprising:

(a) first and second inverters cross-coupled to define first and second storage nodes, a first pass transistor coupled between a first read/write bus and the first storage node, a second pass transistor coupled between a logic low voltage reference signal source and the second storage node, the first pass transistor further coupled to a read/write enable line for controllably switching the first pass transistor on or off, the second pass transistor further coupled to a write assist line for controllably switching the second pass transistor on or off, one of the first and second pass transistors being an NMOS transistor and the other one of the first and second pass transistors being a PMOS transistor; and, (b) third and fourth inverters cross-coupled to define third and fourth storage nodes, a third pass transistor coupled between a second read/write bus and the third storage node, a fourth pass transistor coupled between the logic low voltage reference signal source and the fourth storage node, the third pass transistor further coupled to the read/write enable line for controllably switching the third pass transistor on or off, the fourth pass transistor further coupled to the write assist line for controllably switching the fourth pass transistor on or off, one of the third and fourth pass transistors being an NMOS transistor and the other one of the third and fourth pass transistors being a PMOS transistor.

26. A memory array as defined in claim 25, wherein the first and third pass transistors are NMOS transistors and the second and fourth pass transistors are PMOS transistors.

27. A memory array comprising a plurality of quadruplets of bit cells, each quadruplet of bit cells further comprising:

(a) first and second inverters cross-coupled to define first and second storage nodes, a first pass transistor coupled between a first read/write bus and the first storage node, a second pass transistor coupled between a logic low voltage reference signal source and the second storage node, the first pass transistor further coupled to a first read/write enable line for controllably switching the first pass transistor on or off, the second pass transistor further coupled to a write assist line for controllably switching the second pass transistor on or off, one of the first and second pass transistors being an NMOS transistor and the other one of the first and second pass transistors being a PMOS transistor;

(b) third and fourth inverters cross-coupled to define third and fourth storage nodes, a third pass transistor coupled between the first read/write bus and the third storage node, a fourth pass transistor coupled between the logic low voltage reference signal source and the fourth storage node, the third pass transistor further coupled to a second read/write enable line for controllably switching the third pass transistor on or off, the fourth pass transistor further coupled to the write assist line for controllably switching the fourth pass transistor on or off, one of the third and fourth pass transistors being an NMOS transistor and the other one of the third and fourth pass transistors being a PMOS transistor;

(c) fifth and sixth inverters cross-coupled to define fifth and sixth storage nodes, a fifth pass transistor coupled between a second read/write bus and a fifth storage node, a sixth pass transistor coupled between the logic low voltage reference signal source and the sixth storage node, the fifth pass transistor further coupled to the first read/write enable time for controllably switching the fifth pass transistor on or off, the sixth pass transistor further coupled to the write assist line for controllably switching the sixth pass transistor on or off, one of the fifth and sixth pass transistors being an NMOS transistor and the other one of the fifth and sixth pass transistors being a PMOS transistor; and, (d) seventh and eighth inverters cross-coupled to define seventh and eighth storage nodes, a seventh pass transistor coupled between the second read/write bus and the seventh storage node, an eighth pass transistor coupled between the logic low voltage reference signal source and the eighth storage node, the seventh pass transistor further coupled to the second read/write enable line for controllably switching the seventh pass transistor on or off, the eighth pass transistor further coupled to the write assist line for controllably switching the eighth pass transistor on or off, one of the seventh and eighth pass transistors being an NMOS transistor and the other one of the seventh and eighth pass transistors being a PMOS transistor.

28. A memory array as defined in claim 27, wherein the first, third, fifth and seventh pass transistors are NMOS transistors and the second, fourth, sixth and eighth pass transistors are PMOS transistors.

*29. A memory cell, comprising:*

*a pair of inverters, wherein the pair of inventors comprise a first storage node and a second storage node;*

*a first pass transistor coupled between the first storage node and a write bus;*

*a write enable line coupled to a switching terminal of the first pass transistor;*

*a second pass transistor coupled between the second storage node and a read bus;*

*a read enable line coupled to a switching terminal of the second pass transistor;*

*a precharge transistor coupled to the read bus; and*

*a precharge enable signal coupled to a switching terminal of the precharge transistor.*

*30. The memory cell of claim 29, wherein:*

*a first inverter of the pair of inverters comprises a PMOS pull-up transistor and an NMOS pull-down transistor, and further wherein the pull-up transistor and the pull-down transistor of the first inverter define the first storage node;*

*a second inverter of the pair of inverters comprises a PMOS pull-up transistor and an NMOS pull-down transistor, and further wherein the pull-up transistor and the pull-down transistor of the second inverter define the second storage node; and*

*the first pass transistor comprises an NMOS transistor, the second pass transistor comprises a PMOS transistor, and the precharge transistor comprises an NMOS transistor.*

*31. The memory cell of claim 30, wherein each one of the inverters further comprises series-connected terminals defining one of the storage nodes, the series-connected terminals further comprising:*

*drain terminals of the respective inverter pull-up and pull-down transistors coupled together,*

*a logically high voltage reference signal applied to a source terminal of each one of the pull-up transistors,*

*a logically low voltage reference signal applied to a source terminal of each one of the pull-down transistors,*

*a switching terminal of the first inverter pull-up transistor coupled to a switching terminal of the first inverter pull-down transistor,*

*a switching terminal of the second inverter pull-up transistor coupled to a switching terminal of the second inverter pull-down transistor,*

*the first inverter pull-up and pull-down transistor switching terminals further coupled to the second inverter series-connected terminals,*

*the second inverter pull-up and pull-down transistor switching terminals further coupled to the first inverter series-connected terminals,*

*a source-to-drain path of the first pass transistor coupled between the write bus and the first storage node,*

*a source-to-drain path of the second pass transistor coupled between the read bus and the second storage node, and*

*a source-to-drain path of the pre-charge transistor coupled between the read bus and the logic low voltage reference signal source.*

*32. The memory cell of claim 31, further comprising drive circuitry capable of:*

*logically combining decoded first and second read signals to produce a read enable signal;*

*logically inverting the read enable signal to produce a complementary read enable signal;*

*applying the complementary read enable signal to the read enable line to turn the second pass transistor on;*

*logically combining a write strobe signal with the read enable signal to produce a write enable signal;*

*applying the write enable signal to the write enable line to turn the first pass transistor on;*

*if the pre-charge transistor is off, applying a pre-charge enable signal to the pre-charge enable line to turn the precharge transistor on; and,*

*if the pre-charge transistor is on, applying the pre-charge enable signal to the pre-charge enable line to keep the precharge transistor turned on;*

*while concurrently:*

*writing data on the write bus into the bit cell;*

*reading data from the bit cell onto the read bus; and,*

*maintaining the read bus in a logically low state.*

*33. The memory cell of claim 32, wherein the drive circuitry is further capable of:*

*applying a logical complement of the write enable signal to the write enable line to turn the first pass transistor off;*

*applying the complementary read enable signal to the read enable line to turn the second pass transistor on; and,*

*initially applying the pre-charge enable signal to the pre-charge enable line to initially turn the pre-charge transistor on, applying a logical complement of the pre-charge enable signal to the pre-charge enable line to turn the pre-charge transistor off for a brief time interval, and applying the pre-charge enable signal to the pre-charge enable line to turn the pre-charge transistor on,*

*while reading data from the bit cell onto the read bus without simultaneously writing data on the write bus into the bit cell.*

*34. A memory array, comprising:*

*a plurality of bit cells, at least one bit cell comprising*

*a pair of inverters, wherein the pair of inventors comprise a first storage node and a second storage node,*

*a first pass transistor coupled between the first storage node and a write bus,*

*a write enable line coupled to a switching terminal of the first pass transistor,*

*a second pass transistor coupled between the second storage node and a read bus, and*

*a read enable line coupled to a switching terminal of the second pass transistor;*

*a precharge transistor coupled to the read bus; and*

*a precharge enable signal coupled to a switching terminal of the precharge transistor.*

*35. The memory array of claim 34, wherein for said at least one bit cell:*

*a first inverter of the pair of inverters comprises a PMOS pull-up transistor and an NMOS pull-down transistor, and further wherein the pull-up transistor and the pull-down transistor of the first inverter define the first storage node;*

*a second inverter of the pair of inverters comprises a PMOS pull-up transistor and an NMOS pull-down*

*transistor, and further wherein the pull-up transistor and the pull-down transistor of the second inverter defined the second storage node; and*

*the first pass transistor comprises an NMOS transistor, the second pass transistor comprises a PMOS transistor, and the precharge transistor comprises an NMOS transistor.*

*36. The memory array of claim 35, wherein for said at least one bit cell each of the inverters further comprises series-connected terminals defining one of the storage nodes, the series-connected terminals further comprising:*

*drain terminals of the respective inverter pull-up and pull-down transistors coupled together,*

*a logically high voltage reference signal applied to a source terminal of each one of the pull-up transistors,*

*a logically low voltage reference signal applied to a source terminal of each one of the pull-down transistors,*

*a switching terminal of the first inverter pull-up transistor coupled to a switching terminal of the first inverter pull-down transistor,*

*a switching terminal of the second inverter pull-up transistor coupled to a switching terminal of the second inverter pull-down transistor,*

*the first inverter pull-up and pull-down transistor switching terminals further coupled to the second inverter series-connected terminals,*

*the second inverter pull-up and pull-down transistor switching terminals further coupled to the first inverter series-connected terminals,*

*a source-to-drain path of the first pass transistor coupled between the write bus and the first storage node,*

*a source-to-drain path of the second pass transistor coupled between the read bus and the second storage node, and*

*a source-to-drain path of the pre-charge transistor coupled between the read bus and the logic low voltage reference signal source.*

*37. The memory array of claim 34, further comprising, for at least one row, a driver capable of:*

*logically combining decoded first and second read signals to produce a read enable signal;*

*logically inverting the read enable signal to produce a complementary read enable signal;*

*applying the complementary read enable signal to the read enable line to turn the second pass transistor on;*

*logically combining a write strobe signal with the read enable signal to produce a write enable signal;*

*applying the write enable signal to the write enable line to turn the first pass transistor on;*

*if the pre-charge transistor is off, applying a pre-charge enable signal to the pre-charge enable line to turn the precharge transistor on; and,*

*if the pre-charge transistor is on, applying the pre-charge enable signal to the pre-charge enable line to keep the precharge transistor turned on;*

*while concurrently:*

*writing data on the write bus into the bit cell;*

*reading data from the bit cell onto the read bus; and,*

*maintaining the read bus in a logically low state.*

*38. A memory array as defined in claim 37, wherein the driver is further capable of:*

*applying a logical complement of the write enable signal to the write enable line to turn the first pass transistor off;*

*applying the complementary read enable signal to the read enable line to turn the second pass transistor on; and,*

*initially applying the pre-charge enable signal to the pre-charge enable line to initially turn the pre-charge transistor on, applying a logical complement of the pre-charge enable signal to the pre-charge enable line to turn the pre-charge transistor off for a brief time interval, and applying the pre-charge enable signal to the pre-charge enable line to turn the pre-charge transistor on,*

*while reading data from the bit cell onto the read bus without simultaneously writing data on the write bus into the bit cell.*

*39. A method of writing a binary digit value asserted on a write bus into a memory bit cell, the bit cell comprising first and second storage nodes, a first pass transistor coupled between the write bus and the first storage node, a second pass transistor coupled between a read bus and the second storage node, the first pass transistor further coupled to a write enable line and capable of controllably switching the first pass transistor to be one of on and off, the second pass transistor further coupled to a read enable line and capable of controllably switching the second pass transistor to be one of on and off, and a pre-charge transistor coupled between the read bus and a logically low voltage reference signal source, the method comprising:*

*turning the first pass transistor on;*

*turning the second pass transistor on;*

*if the pre-charge transistor is off, turning the pre-charge transistor on; and,*

*if the pre-charge transistor is on, keeping the pre-charge transistor turned on.*

*40. The method of claim 39, wherein the bit cell further comprises first and second cross-coupled inverters defining the first and second storage nodes.*

*41. A method of reading onto a read bus a binary digit value stored in a memory bit cell, the bit cell comprising first and second inverters defining first and second storage nodes, a first pass transistor coupled between the write bus and the first storage node, a second pass transistor coupled between a read bus and the second storage node, the first pass transistor further coupled to a write enable line and capable of controllably switching the first pass transistor to be one of on and off, the second pass transistor further coupled to a read enable line and capable of controllably switching the second pass transistor to be one of on and off, and a pre-charge transistor coupled between the read bus and a logic low voltage reference signal source, the method comprising:*

*turning the first pass transistor off;*

*turning the second pass transistor on; and,*

*initially turning the pre-charge transistor on, then turning the pre-charge transistor off for a brief interval, then turning the pre-charge transistor on.*

*42. The method of claim 41, wherein the bit cell further comprises first and second cross-coupled inverters defining the first and second storage nodes.*

*43. A memory bit cell comprising:*

*first and second storage nodes;*

*a first pass transistor coupled between a read/write bus and the first storage node; and*

*a second pass transistor coupled between a logically low voltage reference signal source and the second storage node,*

*the first pass transistor further coupled to a read/write enable line wherein the read/write enable line is*

*capable of controllably switching the first pass transistor to be one of on and off,*

*the second pass transistor further coupled to a write assist line wherein the write assist line is capable of controllably switching the second pass transistor to be one of on and off,*

*wherein one of the first and second pass transistors comprises an NMOS transistor and the other one of the first and second pass transistors comprises a PMOS transistor.*

*44. The memory bit cell of claim 43, wherein the memory bit cell further comprises first and second inverters defining first and second storage nodes, and wherein:*

*the first inverter further comprises a first pull-up transistor and a first pull-down transistor defining the first storage node;*

*the second inverter further comprises a second pull-up transistor and a second pull-down transistor defining the second storage node;*

*the pull-down transistors and the first pass transistor comprise NMOS transistors; and,*

*the pull-up transistors and the second pass transistor comprise PMOS transistors.*

*45. The memory bit of claim 44, wherein the first pull-up transistor and the first pull-down transistor comprise series-connected terminals defining the first storage node,*

*wherein the second pull-up transistor and the second pull-down transistor comprise series-connected terminals defining the second storage node,*

*wherein the series-connected terminals further comprise drain terminals of the respective inverter pull-up and pull-down transistors,*

*wherein a logically high voltage reference signal is applied to a source terminal of each one of the pull-up transistors and the logically low voltage reference signal is applied to a source terminal of each one of the pull-down transistors,*

*wherein a switching terminal of the first inverter pull-up transistor is coupled to a switching terminal of the first inverter pull-down transistor and a switching terminal of the second inverter pull-up transistor is coupled to a switching terminal of the second inverter pull-down transistor,*

*wherein the first inverter pull-up and pull-down transistor switching terminals are further coupled to the second inverter series-connected terminals and the second inverter pull-up and pull-down transistor switching terminals are further coupled to the first inverter series-connected terminals,*

*wherein a source-to-drain path of the first transistor is coupled between the read/write bus and the first storage node and a source-to-drain path of the second pass transistor is coupled between the logic low voltage reference signal source and the second storage node, and*

*wherein a switching terminal of the first pass transistor is coupled to the read/write enable line, and a switching terminal of the second pass transistor is coupled to the write assist line.*

*46. The memory bit cell of claim 45, further comprising circuitry capable of:*

*logically combining decoded first and second read signals to produce a read/write enable signal;*

*applying the read/write enable signal to the read/write enable line to turn the first pass transistor on;*

*logically combining a write strobe signal with the read/write enable signal to produce a write assist signal; and,*

*applying the write assist signal to the write assist line to turn the second pass transistor on;*

*while performing one of:*

*writing data on the read/write bus into the bit cell; and reading data from the bit cell onto the read/write bus.*

*47. A multiple-row and multiple-column memory array comprising:*

*a plurality of bit cells, at least one bit cell comprising:*

*first and second storage nodes;*

*a first pass transistor coupled between a read/write bus and the first storage node; and*

*a second pass transistor coupled between a logically low voltage reference signal source and the second storage node,*

*the first pass transistor further coupled to a read/write enable line wherein the read/write enable line is capable of controllably switching the first pass transistor to be one of on and off,*

*the second pass transistor further coupled to a write assist line wherein the write assist line is capable of controllably switching the second pass transistor to be one of on and off,*

*wherein one of the first and second pass transistors comprises an NMOS transistor and the other one of the first and second pass transistors comprises a PMOS transistor.*

*48. The memory array of claim 47, wherein said at least one bit cell further comprises first and second inverters cross-coupled to define first and second storage nodes, and wherein:*

*the first inverter further comprises a first pull-up transistor and a first pull-down transistor having series-connected terminals defining the first storage node;*

*the second inverter further comprises a second pull-up transistor and a second pull-down transistor having series-connected terminals defining the second storage node;*

*the pull-down transistors and the first pass transistors are NMOS transistors; and,*

*the pull-up transistors and the second pass transistors are PMOS transistors.*

*49. The memory array of claim 48, wherein the series-connected terminals further comprise drain terminals of the respective inverter pull-up and pull-down transistors,*

*wherein the logic high voltage reference signal is applied to a source terminal of each one of the pull-up transistors and the logic low voltage reference signal is applied to a source terminal of each one of the pull-down transistors,*

*wherein a switching terminal of the first inverter pull-up transistor is coupled to a switching terminal of the first inverter pull-down transistor and a switching terminal of the second inverter pull-up transistor is coupled to a switching terminal of the second inverter pull-down transistor,*

*wherein the first inverter pull-up and pull-down transistor switching terminals are further coupled to the second inverter series-connected terminals and the second inverter pull-up and pull-down transistor switching terminals are further coupled to the first inverter series-connected terminals,*

*wherein a source-to-drain path of the first pass transistor is coupled between the read/write bus and the first stor-*

*age node and a source-to-drain path of the second pass transistor is coupled between the logic low voltage reference signal source and the second storage node, and*

*wherein a switching terminal of the first pass transistor is coupled to the read/write enable line, and a switching terminal of the second pass transistor is coupled to the write assist line.*

*50. The memory array of claim 47, further comprising, for each row, a driver capable of:*

*logically combining decoded first and second read signals to produce a read/write enable signal;*

*applying the read/write enable signal to the read/write enable line to turn on the first pass transistor in each bit cell in the row;*

*logically combining a write strobe signal with the read/write enable signal to produce a write assist signal; and,*

*applying the write assist signal to the write assist line to turn on the second pass transistor in each bit cell in the row;*

*while performing one of:*

*writing data on the read/write bus into the bit cell; and reading data from the bit cell onto the read/write bus.*

*51. A method of writing a binary digit value asserted on a read/write bus into a memory bit cell, the bit cell comprising first and second storage nodes, a first pass transistor coupled between the read/write bus and the first storage node, a second pass transistor coupled between a logically low voltage reference signal source and the second storage node, the first pass transistor further coupled to a read/write enable line and capable of controllably switching the first pass transistor to be one of on and off, the second pass transistor further coupled to a write assist line and capable of controllably switching the second pass transistor to be one of on and off, the method comprising:*

*turning the first and second pass transistors on.*

*52. The method of claim 51, wherein the bit cell further comprises first and second inverters cross-coupled to define first and second storage nodes.*

*53. A method of reading onto a read/write bus a binary digit value stored in a memory bit cell, the bit cell comprising first and second storage nodes, a first pass transistor coupled between the read/write bus and the first storage node, a second pass transistor coupled between a logically low voltage reference signal source and the second storage node, the first pass transistor further coupled to a read/write enable line and capable of controllably switching the first pass transistor to be one of on and off, the second pass transistor further coupled to a write assist line and capable of controllably switching the second pass transistor to be one of on and off, the method comprising:*

*turning the first pass transistor on and turning the second pass transistor off.*

*54. The method of claim 53, wherein the bit cell further comprises first and second inverters cross-coupled to define first and second storage nodes.*

*55. A memory array comprising a plurality of pairs of bit cells, at least one pair of bit cells comprising:*

*first and second inverters defining first and second storage nodes, a first pass transistor coupled between a read/write bus and the first storage node, a second pass transistor coupled between a logically low voltage reference signal source and the second storage node, the first pass transistor further coupled to a first read/write enable line and capable of controllably switching the first pass transistor to be one of on and off, the second pass transistor further coupled to a write assist line and capable of controllably switching the second pass transistor to be one of on and off, one of the first and second pass transistors comprising an NMOS transistor and the other one of the first and second pass transistors comprising the PMOS transistor; and*

*third and fourth inverters defining third and fourth storage nodes, a third pass transistor coupled between the read/write bus and the third storage node, a fourth pass transistor coupled between the logically low voltage reference signal source and the fourth storage node, the third pass transistor further coupled to a second read/write enable line and capable of controllably switching the third pass transistor to be one of on and off, the fourth pass transistor further coupled to the write assist line and capable of controllably switching the fourth pass transistor to be one of on and off, one of the third and fourth pass transistors comprising an NMOS transistor and the other one of the third and fourth pass transistors comprising a PMOS transistor.*

*56. The memory array of claim 55, wherein the first and second inverters are cross-coupled to define the first and second storage nodes, and wherein the third and fourth inverters are cross-coupled to define the third and fourth storage nodes.*

*57. The memory array of claim 55, wherein the first and third pass transistors comprise NMOS transistors and the second and fourth pass transistors comprise PMOS transistors.*

*58. A memory array comprising a plurality of pairs of bit cells, at least one pair of bit cells comprising:*

*first and second inverters defining first and second storage nodes, a first pass transistor coupled between a first read/write bus and the first storage node, a second pass transistor coupled between a logic low voltage reference signal source and the second storage node, the first pass transistor further coupled to a read/write enable line and capable of controllably switching the first pass transistor to be one of on and off, the second pass transistor further coupled to a write assist line and capable of controllably switching the second pass transistor to be one of on and off, one of the first and second pass transistors comprising an NMOS transistor and the other one of the first and second pass transistors comprising a PMOS transistor; and,*

*third and fourth inverters defining third and fourth storage nodes, a third pass transistor coupled between a second read/write bus and the third storage node, a fourth pass transistor coupled between the logic low voltage reference signal source and the fourth storage node, the third pass transistor further coupled to the read/write enable line and capable of controllably switching the third pass transistor to be one of on and off, the fourth pass transistor further coupled to the write assist line and capable of controllably switching the fourth pass transistor to be one of on and off, one of the third and fourth pass transistors comprising an NMOS transistor and the other one of the third and fourth pass transistors comprising a PMOS transistor.*

*59. The memory array of claim 58, wherein the first and second inverters are cross-coupled to define the first and second storage nodes, and wherein the third and fourth inverters are cross-coupled to define the third and fourth storage nodes.*

*60. The memory array of claim 58, wherein the first and third pass transistors comprise NMOS transistors and the second and fourth pass transistors comprise PMOS transistors.*

*61. A memory array comprising a plurality of quadruplets of bit cells, at least one quadruplet of bit cells comprising:*

*first and second inverters defining first and second storage nodes, a first pass transistor coupled between a first read/write bus and the first storage node, a second pass transistor coupled between a logic low voltage reference signal source and the second storage node, the first pass transistor further coupled to a first read/write enable line and capable of controllably switching the first pass transistor to be one of on and off, the second pass transistor further coupled to a write assist line and capable of controllably switching the second pass transistor to be one of on and off, one of the first and second pass transistors comprising an NMOS transistor and the other one of the first and second pass transistors comprising a PMOS transistor;*

*third and fourth inverters defining third and fourth storage nodes, a third pass transistor coupled between the first read/write bus and the third storage node, a fourth pass transistor coupled between the logic low voltage reference signal source and the fourth storage node, the third pass transistor further coupled to a second read/write enable line and capable of controllably switching the third pass transistor to be one of on and off, the fourth pass transistor further coupled to the write assist line and capable of controllably switching the fourth pass transistor to be one of on and off, one of the third and fourth pass transistors comprising an NMOS transistor and the other one of the third and fourth pass transistors comprising a PMOS transistor;*

*fifth and sixth inverters defining fifth and sixth storage nodes, a fifth pass transistor coupled between a second read/write bus and the fifth storage node, a sixth pass transistor coupled between the logic low voltage reference signal source and the sixth storage node, the fifth pass transistor further coupled to the first read/write enable line and capable of controllably switching the fifth pass transistor to be one of on and off, the sixth pass transistor further coupled to the write assist line and capable of controllably switching the sixth pass transistor to be one of on and off, one of the fifth and sixth pass transistors comprising an NMOS transistor and the other one of the fifth and sixth pass transistors comprising a PMOS transistor; and,*

*seventh and eighth inverters defining seventh and eighth storage nodes, a seventh pass transistor coupled between the second read/write bus and the seventh storage node, an eighth pass transistor coupled between the logic low voltage reference signal source and the eighth storage node, the seventh pass transistor further coupled to the second read/write enable line and capable of controllably switching the seventh pass transistor to be one of on and off, the eighth pass transistor further coupled to the write assist line and capable of controllably switching the eighth pass transistor to be one of on and off, one of the seventh and eighth pass transistors comprising an NMOS transistor and the other one of the seventh and eighth pass transistors comprising a PMOS transistor.*

*62. The memory array of claim 61, wherein the first and second inverters are cross-coupled to define first and second storage nodes, wherein the third and fourth inverters are cross-coupled to define the third and fourth storage nodes, wherein the fifth and sixth inverters are cross-coupled to define the fifth and sixth storage nodes, and wherein the seventh and eighth inverters are cross-coupled to define the seventh and eighth storage nodes.*

*63. The memory array of claim 61, wherein the first, third, fifth and seventh pass transistors comprise NMOS transistors and the second, fourth, sixth and eighth pass transistors comprise PMOS transistors.*

*64. The memory of claim 29, wherein the pair of inverters comprise cross-coupled invertors.*

*65. The memory array of claim 34, wherein the pair of inverters comprise cross-coupled invertors.*

* * * * *

UNITED STATES PATENT AND TRADEMARK OFFICE

CERTIFICATE OF CORRECTION

PATENT NO. : RE42,145 E
APPLICATION NO. : 11/581231
DATED : February 15, 2011
INVENTOR(S) : Hobson It is certified that error appears in the above-identified patent and that said Letters Patent is hereby corrected as shown below:

Column 9, line 49, in Claim 3, delete "inverter" and insert -- inverter pull-up and --.

Column 10, line 15, in Claim 4, delete "when" and insert -- with --.

Column 11, line 20, in Claim 8, before "transistor," delete "pull-up" and insert -- pull-down --.

Column 11, line 29, in Claim 8, delete "voltage" and insert -- storage --.

Column 11, line 30, in Claim 8, delete "second" and insert -- second pass --.

Column 12, line 4, in Claim 10, delete "when" and insert -- with --.

Column 12, line 20, in Claim 11, delete "digital" and insert -- digit --.

Column 12, line 50, in Claim 12, delete "off, a" and insert -- off, and a --.

Column 14, line 37, in Claim 19, delete "second" and insert -- second pass --.

Column 14, line 40, in Claim 19, delete "transistor" and insert -- transistor is --.

Column 14, line 55, in Claim 20, delete "turn" and insert -- turn on --.

Column 14, line 61, in Claim 21, delete "digital" and insert -- digit --.

Column 15, line 3, in Claim 21, delete "assisted" and insert -- assist --.

Column 15, line 18, in Claim 22, delete "turing" and insert -- turning --.

Column 16, line 45, in Claim 27, delete "a fifth" and insert -- the fifth --.

Column 16, line 49, in Claim 27, delete "time" and insert -- line --.

Column 17, line 8, in Claim 29, delete "*inventors*" and insert -- *inverters* --.

Signed and Sealed this
Nineteenth Day of July, 2011

David J. Kappos

David J. Kappos
*Director of the United States Patent and Trademark Office*

Column 18, line 45, in Claim 34, delete "*comprising*" and insert -- *comprising:* --.

Column 18, line 46, in Claim 34, delete "*inventors*" and insert -- *inverters* --.

Column 19, line 63, in Claim 38, delete "*A memory array as defined in claim 37*," and insert -- *The memory array of claim 37*, --.

Column 20, line 54, in Claim 41, delete "*brief*" and insert -- *brief time* --.

Column 21, line 25, in Claim 45, delete "*bit*" and insert -- *bit cell* --.

Column 21, line 52, in Claim 45, delete "*first*" and insert -- *first pass* --.

Column 24, line 6, in Claim 55, delete "*the PMOS*" and insert -- a *PMOS* --.

Column 26, line 34, in Claim 64, delete "*memory*" and insert -- *memory cell* --.

Column 26, line 35, in Claim 64, delete "*invertors.*" and insert -- *inverters.* --.

Column 26, line 37, in Claim 65, delete "*invertors.*" and insert -- *inverters.* --.